US010382017B1

(12) United States Patent
Berzins et al.

(10) Patent No.: US 10,382,017 B1
(45) Date of Patent: Aug. 13, 2019

(54) DYNAMIC FLIP FLOP HAVING DATA INDEPENDENT P-STACK FEEDBACK

(71) Applicant: Samsung Electronics Co., Ltd., Suwon-si, Gyeonggi-do (KR)

(72) Inventors: Matthew Berzins, Cedar Park, TX (US); Sumanth Suraneni, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 16/151,338

(22) Filed: Oct. 3, 2018

Related U.S. Application Data

(60) Provisional application No. 62/696,330, filed on Jul. 10, 2018.

(51) Int. Cl.
*H03K 3/356* (2006.01)

(52) U.S. Cl.
CPC . *H03K 3/356069* (2013.01); *H03K 3/356017* (2013.01)

(58) Field of Classification Search
CPC ....... H03K 3/356069; H03K 3/356017; H03K 3/0233; H03K 3/037; H03K 3/12
See application file for complete search history.

(56) References Cited

U.S. PATENT DOCUMENTS

| | | | |
|---|---|---|---|
| 5,929,660 A * | 7/1999 | Dillinger | G11C 7/067 327/51 |
| 7,154,319 B2 | 12/2006 | Kim | |
| 7,994,836 B2 | 8/2011 | Hart et al. | |
| 9,923,552 B2 | 3/2018 | Blutman | |

* cited by examiner

*Primary Examiner* — Daniel C Puentes
(74) *Attorney, Agent, or Firm* — Renaissance IP Law Group LLP

(57) ABSTRACT

Inventive aspects include a dynamic flip flop, comprising a data independent P-stack feedback circuit. The data independent P-stack feedback circuit may include a first P-type transistor gated by a first dynamic inverted net signal, and a second P-type transistor gated by an inverted clock signal. A drain of the second P-type transistor may be coupled to a source of the first P-type transistor. A source of the second P-type transistor may be coupled to a node that is configured to receive a second dynamic inverted net signal. The source of the second P-type transistor may be directly coupled to the node that is configured to receive the second dynamic inverted net signal instead of a constant power source. The data independent P-stack feedback circuit may include one or more delay stages to eliminate race conditions.

18 Claims, 7 Drawing Sheets

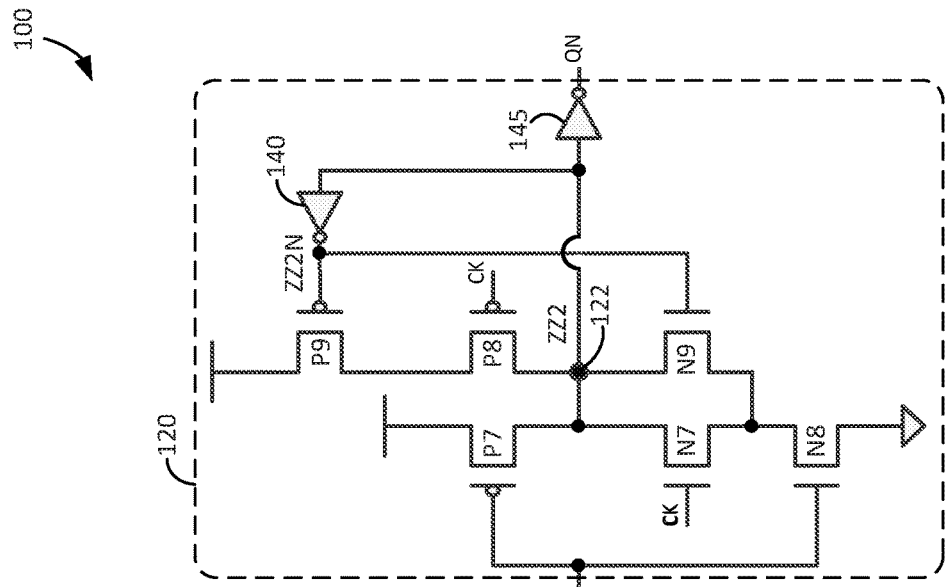
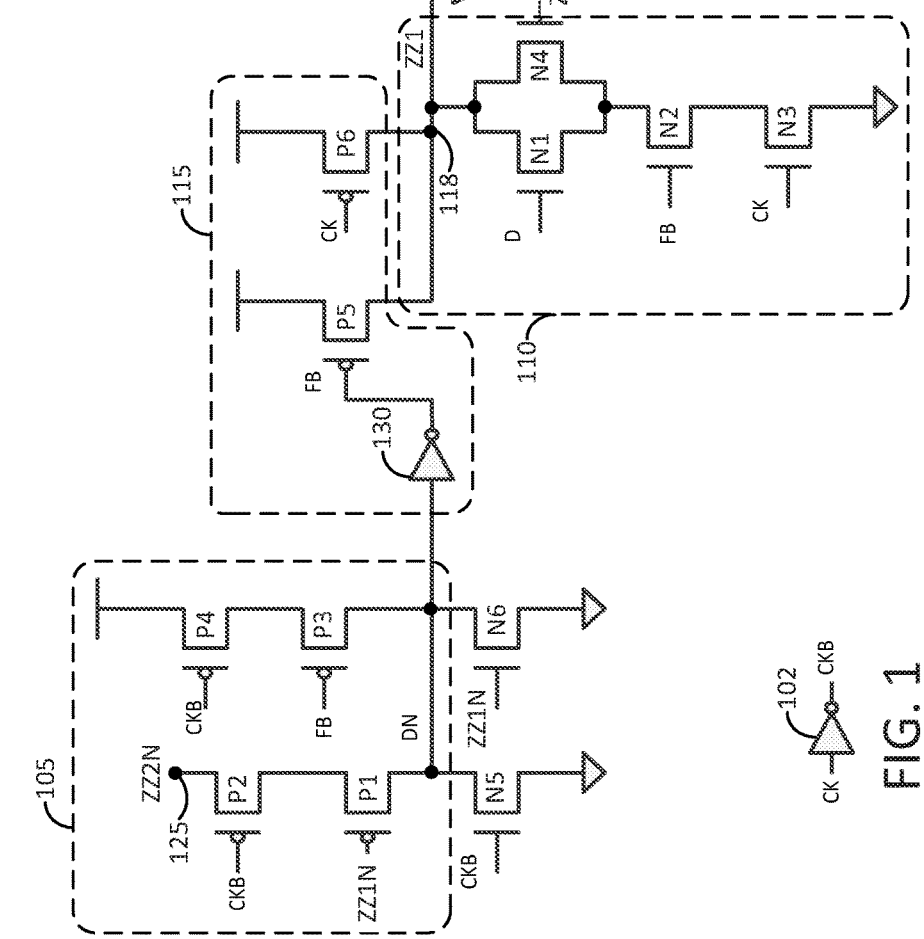
FIG. 1
FIG. 2

DYNAMIC FLIP FLOP HAVING DATA INDEPENDENT P-STACK FEEDBACK

RELATED APPLICATION DATA

This application claims the benefit of U.S. Provisional Application No. 62/696,330, filed on Jul. 10, 2018, which is hereby incorporated by reference.

BACKGROUND

The present inventive embodiments relate to semiconductor circuits, and more particularly, to a dynamic flip flop having a data independent P-stack feedback mechanism, which may integrate a single stage combinational circuit.

A conventional flip flop is a common component used in many integrated circuits. In the ever-growing complex architectures, scenarios of multiple signals converging onto a single flip flop are increasing at an exponential rate. With higher frequency targets, negative setup slack (i.e., data arriving later than the clock arrival) of a path is becoming a bottleneck in many designs. To deal with these and other growing problems, flip flops must be fast and have setup benefit.

For example, when an output of an N:1 multiplexor (MUX) is stitched to a data input pin of a flip flop, an evaluation of the N:1 MUX is the main contributor to a setup requirement of the circuit. In one approach to ameliorating the setup requirement, the N:1 MUX may be integrated into the flip flop. However, with a larger number of inputs N to the MUX, a larger number of signals may converge into the flip flop, and a P-stack in a feedback circuit will become N+2 high. In other words, the P-stack is taller and the N-stack is wider. This increases the total capacitance on internal nodes within the circuit.

What is needed is an improved dynamic flip flop having a data independent P-stack feedback mechanism.

BRIEF SUMMARY

Inventive aspects include a dynamic flip flop, comprising a data independent P-stack feedback circuit. The data independent P-stack feedback circuit may include a first P-type transistor gated by a first dynamic inverted net signal, and a second P-type transistor gated by an inverted clock signal. A drain of the second P-type transistor may be coupled to a source of the first P-type transistor. A source of the second P-type transistor may be coupled to a node that is configured to receive a second dynamic inverted net signal. The source of the second P-type transistor may be directly coupled to the node that is configured to receive the second dynamic inverted net signal instead of a constant power source. The data independent P-stack feedback circuit may include one or more delay stages to eliminate race conditions.

Certain of the inventive features may be best achieved by implementing them in a processor such as within ARM processor core. Other types of processors or application specific integrated circuits (ASICs) can implement the inventive principles disclosed herein. The inventive concepts may be implemented within processors and/or memory modules of a variety of mobile devices such as smart phones, tablets, notebook computers, or the like, or in a variety of stationary devices such as desktop computers, routers, or the like.

BRIEF DESCRIPTION OF THE DRAWINGS

The foregoing and additional features and advantages of the present inventive principles will become more readily apparent from the following detailed description, made with reference to the accompanying figures, in which:

FIG. 1 illustrates an inverter, which shows the difference between a clock signal (CK) and an inverted clock signal (CKB) in accordance with some embodiments.

FIG. 2 is an example diagram of a dynamic flip flop having a data independent P-stack feedback mechanism in accordance with some embodiments.

DETAILED DESCRIPTION

Figure 3:
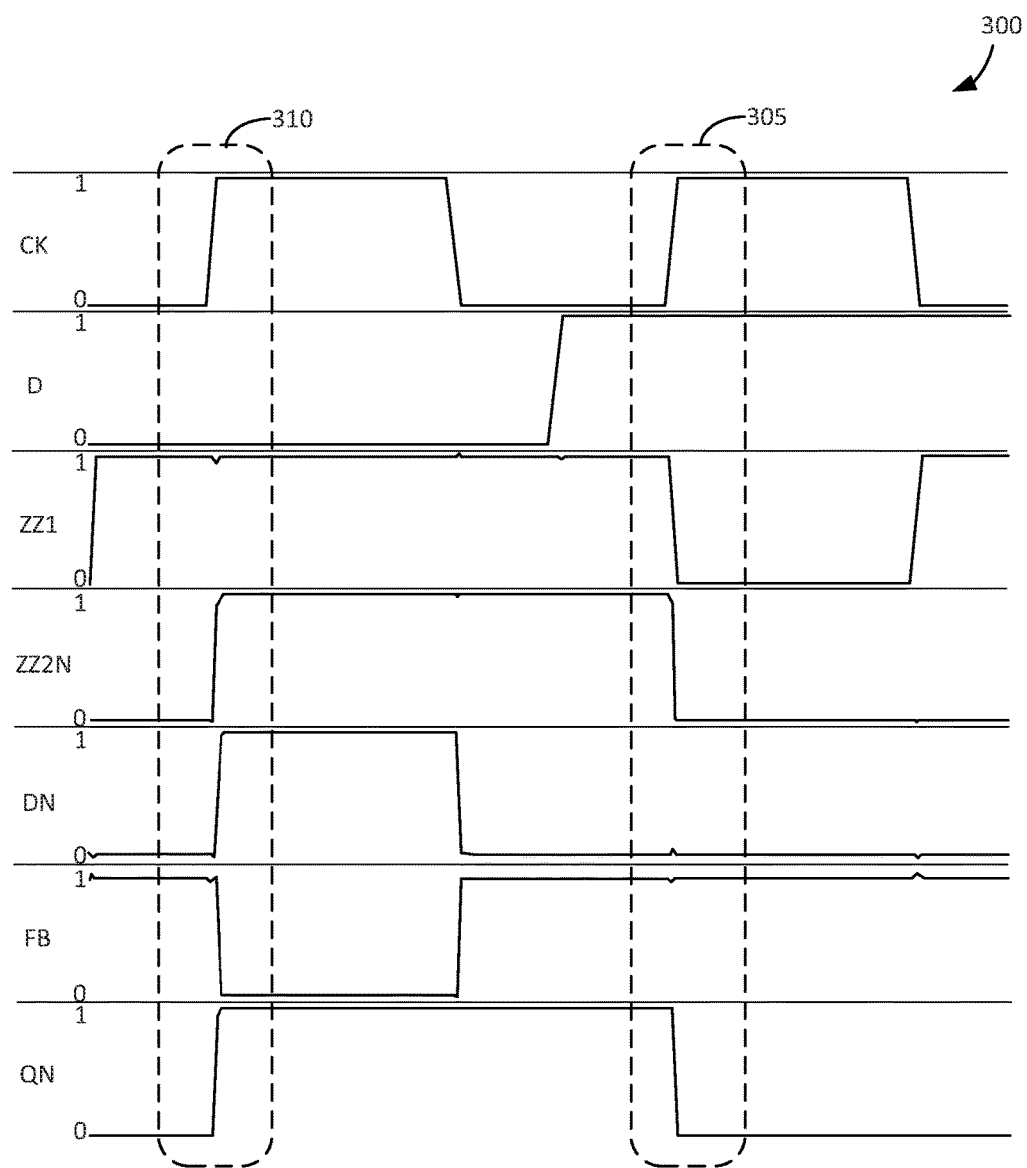
FIG. 3 is an example waveform diagram associated with the dynamic flip flop having the data independent P-stack feedback mechanism in accordance with some embodiments.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first circuit could be termed a second circuit, and, similarly, a second circuit could be termed a first circuit, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments disclosed herein relate to a dynamic flip flop having a data independent P-stack feedback mechanism, which may integrate a single stage combinational circuit. Various single-stage combinational circuits can be integrated into the dynamic flip flop disclosed herein using a data pin independent P-stack feedback mechanism along with other innovative delay techniques described in detail below. This allows the circuit to operate with similar clock-to-output (CK2Q) speed and similar setup on data pins compared to convention flip flops. Less circuit area is needed due to fewer devices used since the need for p-channel metal-oxide-semiconductor field effect transistor (PMOS) devices in a typical N:1 MUX can be eliminated. Leakage power can also be recovered by using different poly length techniques within the circuit. Better setup is achieved compared to simply stitching the MUX and flip flop, even while maintaining a comparable CK2Q delay. Routing congestion can be improved in dense areas where the routing track availability is less. The complete cell can be modeled accurately rather than depending on wire models. As process, temperature, and supply voltage (PVT) lowers, the total data-to-output (D2Q) benefit with the dynamic flip flop disclosed herein becomes more evident. In summary, the dynamic flip flop disclosed herein has better area and dramatically improves the setup on data pins versus simply stitching the combinational circuit with a conventional flip flop.

FIG. 1 illustrates an inverter 102, which shows the difference between a clock signal (CK) and an inverted clock signal (CKB) in accordance with some embodiments, as it relates to FIG. 2. FIG. 2 is an example diagram of a dynamic flip flop 100 having a data independent P-stack feedback mechanism 105 in accordance with some embodiments. Reference is now made to FIGS. 1 and 2.

The dynamic flip flop 100 may include a data independent P-stack feedback circuit 105. The data independent P-stack feedback circuit 105 may include a first P-type transistor P1 gated by a first dynamic inverted net signal ZZ1N. The data independent P-stack feedback circuit 105 may further include a second P-type transistor P2 gated by an inverted clock signal CKB. In some embodiments, a drain of the second P-type transistor P2 is coupled to a source of the first P-type transistor P1. In some embodiments, a source of the second P-type transistor P2 is coupled to a node 125 that is configured to receive a second dynamic inverted net signal ZZ2N.

In some embodiments, the source of the second P-type transistor P2 is directly coupled to the node 125 that is configured to receive the second dynamic inverted net signal ZZ2N instead of a constant power source such as VDD. In some embodiments, the drain of the second P-type transistor P2 is directly coupled to the source of the first P-type transistor P1. The data independent P-stack feedback circuit 105 need not include a transistor gated by a data input signal D.

The dynamic flip flop 100 may further include an N-stack section 110 including an N-type transistor N1 gated by a data input signal D. The N-stack section may further include a second N-type transistor N2 gated by a feedback signal FB, a third N-type transistor N3 gated by a clock signal CK, and a fourth N-type transistor N4 gated by the first dynamic inverted net signal ZZ1N.

The data independent P-stack feedback circuit 105 may further include a third P-type transistor P3 gated by the feedback signal FB, and a fourth P-type transistor P4 gated by the inverted clock signal CKB. In some embodiments, a drain of the first P-type transistor P1 is coupled to a node DN. The dynamic flip flop 100 may further include a fifth N-type transistor N5 gated by the inverted clock signal CKB and coupled to the node DN. The dynamic flip flop 100 may further include a sixth N-type transistor N6 gated by the first dynamic inverted net signal ZZ1N and coupled to the node DN.

The dynamic flip flop 100 may further include an intermediate section 115, which may include a fifth P-type transistor P5 gated by the feedback signal FB and coupled to a node 118 associated with a first dynamic net signal ZZ1. A sixth P-type transistor P6 may be gated by the clock signal CK and coupled to the node 118 associated with the first dynamic net signal ZZ1. The intermediate section 115 may further include an inverter 130 coupled to the fifth P-type transistor P5. In addition, an inverter 135 may be disposed between the node 118 and the fourth N-type transistor N4 of the N-stack section 110.

The dynamic flip flop 100 may further include an output section 120. The output section 120 may include a seventh P-type transistor P7 gated by the first dynamic net signal ZZ1, an eighth P-type transistor P8 gated by the clock signal CK, a ninth P-type transistor P9 gated by the second dynamic inverted net signal ZZ2N, a seventh N-type transistor N7 gated by the clock signal CK, an eighth N-type transistor N8 gated by the first dynamic net signal ZZ1, and a ninth N-type transistor N9 gated by the second dynamic inverted net signal ZZ2N. The node 122 is associated with the signal ZZ2. The output section 120 may also include inverters 140 and 145.

FIG. 3 is an example waveform diagram 300 associated with the dynamic flip flop 100 having the data independent P-stack feedback mechanism in accordance with some embodiments. Reference is now made to FIGS. 1, 2, and 3.

In a conventional flip flop, an additional P-type transistor would be disposed between the transistors P1 and P2. Such an additional P-type transistor disposed in the P-stack of the conventional flip flop would receive a data input signal D. By removing such additional P-type transistor from the P-stack, a race condition would occur between the evaluation path (i.e., the N-stack of the N-stack section 110) and a feedback path as the feedback path would now be independent of the data pin state.

However, to overcome such a race condition, in accordance with embodiments disclosed herein, connecting the source of the P-type transistor P2 to the node 125 associated with the ZZ2N signal instead of VDD has the following effects. When the clock signal CK transitions from a logical 0 to a logical 1, and D is a logical 1, as shown at 305, as the N-stack of the N-stack section 110 evaluates, then the node 118 associated with the ZZ1 signal transitions from a logical 1 to a logical 0; the node 122 associated with the ZZ2 signal transitions from a logical 0 to a logical 1; the signal ZZ2N transitions from a logical 1 to a logical 0; and the output signal QN transitions from a logical 1 to a logical 0. During the same period of time, the inverted clock signal CKB transitions from a logical 1 to a logical 0, and the P-type transistor P2 turns on.

Since $V_{GS}=V_{CKB}$ minus $V_{ZZ2N}$, which in this case: 0 minus 0=0, which is less than $V_{TH}$ of the PMOS, the P-type transistor P2 is turned off, and the feedback P-stack is turned off. Accordingly, the P-stack can no longer result in a race condition with the evaluation of the N-stack. In other words, the faster the node 125 associated with the signal ZZ2N is pulled to zero, the faster the feedback P-stack turns off.

When the clock signal CK is a logical 0, the node 118 associated with the signal ZZ1 is pulled to a logical 1, or in other words, pre-charged. When the data input D is a logical 0, and the clock signal CK transitions from a logical 0 to a logical 1, as shown at 310, then the signal ZZ2N transitions from a logical 0 to a logical 1; the node DN transitions from a logical 0 to a logical 1; the feedback signal FB transitions from a logical 1 to a logical 0, and the output signal QN transitions from a logical 0 to a logical 1.

Figures 4A, 4B:
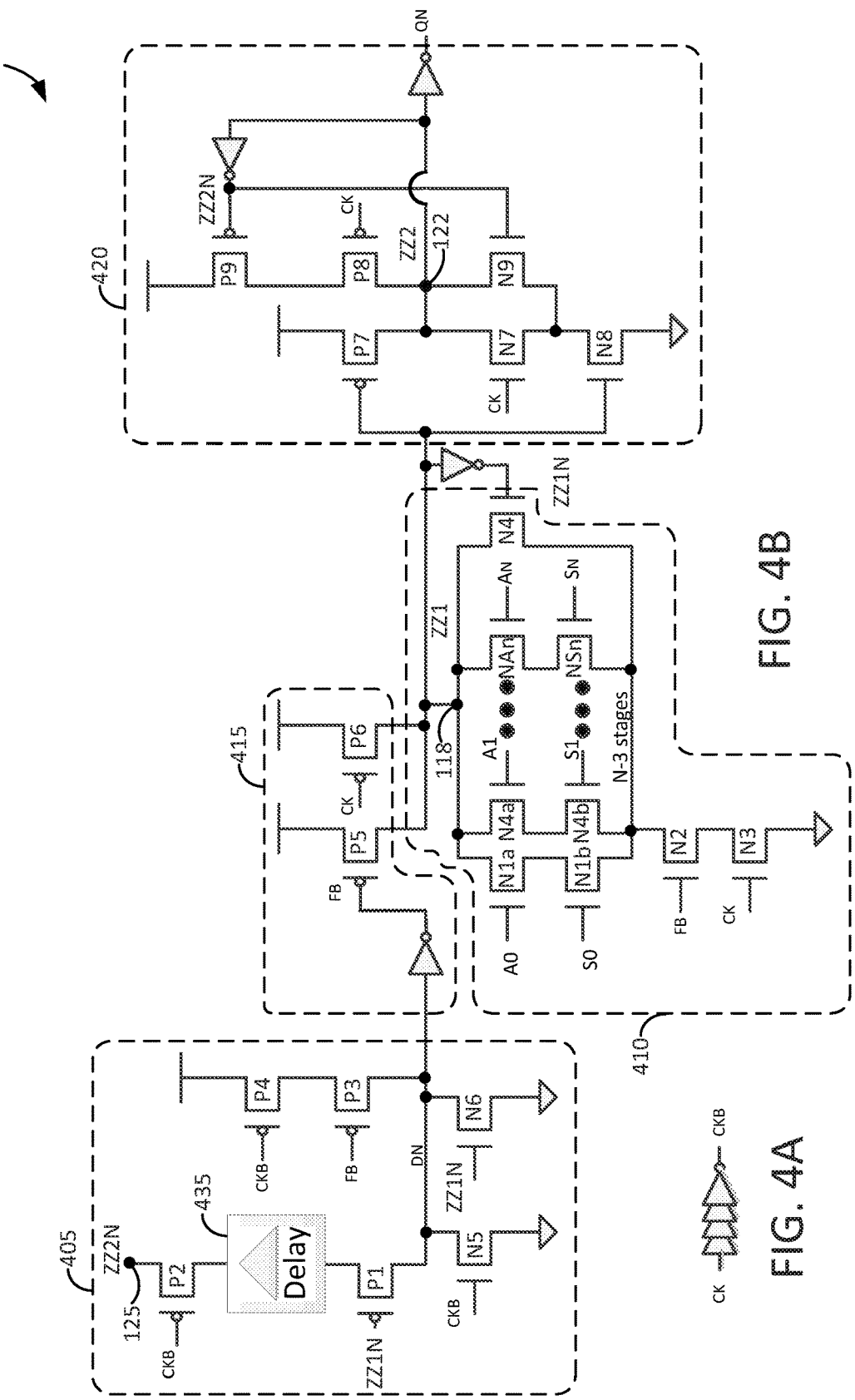
FIG. 4A illustrates a series of multiple inverters, which shows the difference between a clock signal (CK) and an inverted clock signal (CKB) in accordance with some embodiments.
FIG. 4B is an example diagram of yet another dynamic flip flop having a data independent P-stack feedback mechanism in accordance with some embodiments.

FIG. 4A illustrates a series of multiple inverters, which shows the difference between a clock signal (CK) and an inverted clock signal (CKB) in accordance with some embodiments. FIG. 4B is an example diagram of yet another dynamic flip flop 400 having a data independent P-stack feedback mechanism in accordance with some embodiments. Some of the components of the dynamic flip flop 400 are the same as or similar to the components of the dynamic flip flop 100, and for the sake of brevity, descriptions of these components are not necessarily repeated. Reference is now made to FIGS. 4A and 4B.

An N:1 multiplexor (MUX) may be integrated with the dynamic flip flop 400 having the data independent P-stack feedback mechanism. As 'N' in an N:1 MUX increases, a parallel 2-deep N-stack of the N:1 MUX of the N-stack section 410 adds extra capacitance on the node 118 associated with the signal ZZ1, which may slow down a transition of the ZZ1 signal from a logical 1 to a logical 0. In addition, the transition of the ZZ2 signal from a logical 0 to a logical 1, and the transition of the ZZ2N signal from a logical 1 to a logical 0 may also be slowed down. Due to a slower ZZ2N transition from a logical 1 to a logical 0, the feedback loop may start a race condition with the evaluation of the N-stack of the N-stack section 410.

To eliminate any race between the evaluation of the N-stack of the N-stack section 410 and the feedback P-stack of the data independent P-stack feedback circuit 405, the non-critical feedback P-stack may be slowed down using various design techniques like different VT implants, longer poly lengths, longer feedback P-stack, delaying the inverted clock signal CKB transition using multiple delay stages between the clock signal CK and the inverted clock signal CKB, or the like. Accordingly, the P-stack may be slowed down and the leakage power may be reduced.

The dynamic flip flop 400 may include a data independent P-stack feedback circuit 405, an intermediate circuit 415, an N-stack section 410, and an output section 420. In some embodiments, the data independent P-stack feedback circuit 405 includes one or more delay stages 435 disposed anywhere within the P-stack in 405. For example, the one or more delay stages 435 can be disposed above or below P1. By way of another example, the one or more delay stages 435 can be disposed above or below P2. By way of yet another example, the one or more delay stages 435 can be disposed between P1 and P2. The non-critical feedback P-stack may be slowed down using the various design techniques mentioned above. In some embodiments, the one or more delay stages 435 include two or more inverters. In some embodiments, a first inverter from among the two or more inverters is coupled to a source of the first P-type transistor P1, and a second inverter from among the two or more inverters is coupled to a drain of the second P-type transistor P2. In some embodiments, the one or more delay stages 435 include three delay stages.

The N-stack section 410 may include a plurality of N-type transistors (e.g., N1a, N4a, through NAn) each gated by a data input signal (e.g., A0, A1, through An). The N-stack section 410 may include a plurality of N-type select transistors (e.g., N1b, N4b, through NSn) each gated by a select signal (e.g., S0, S1, through SN). The N-stack section 410 may further include an N-type transistor N2 gated by the feedback signal FB, an N-type transistor N3 gated by the clock signal CK, and an N-type transistor N4 gated by the first dynamic inverted net signal ZZ1N.

Figure 5:
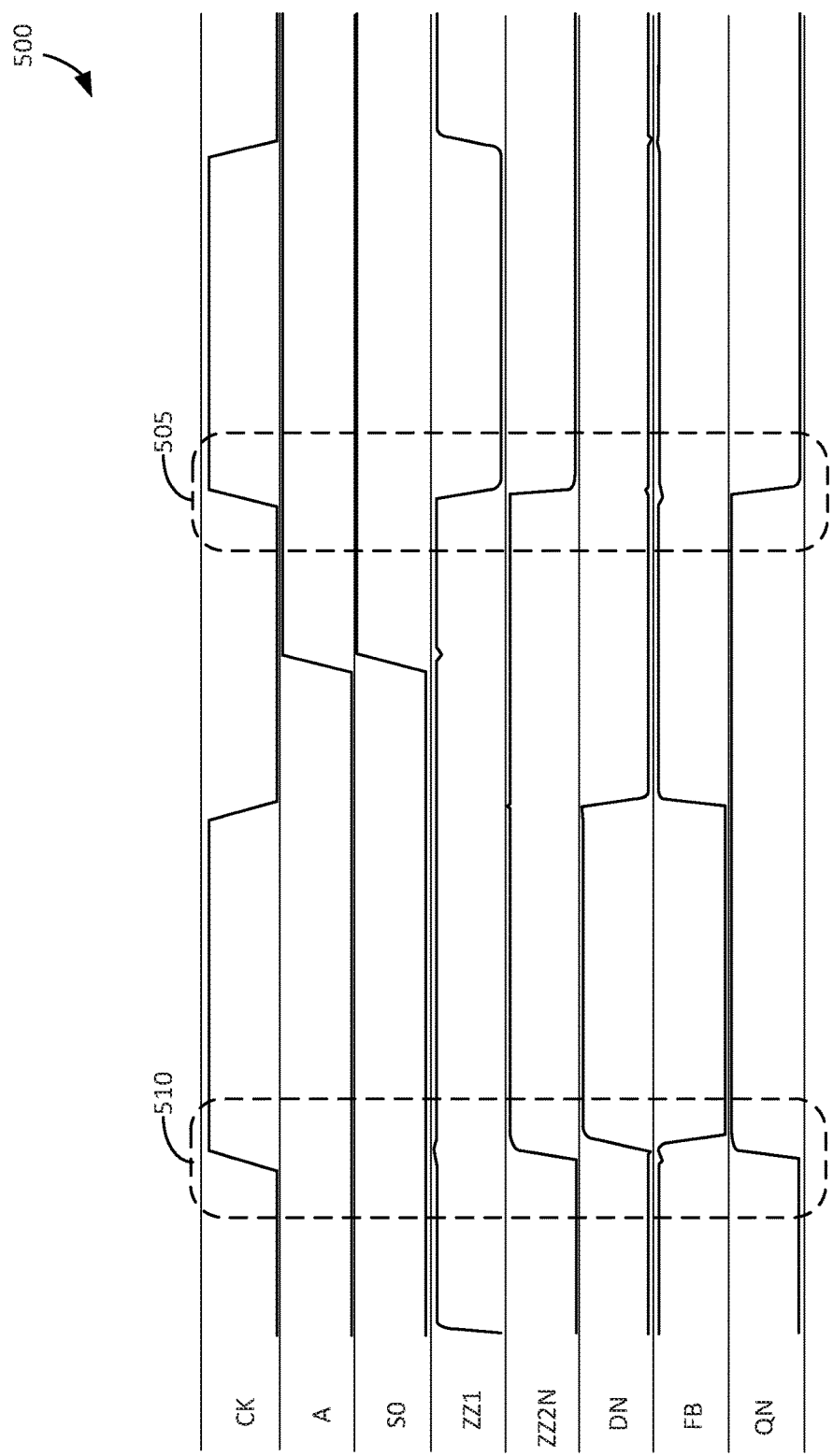
FIG. 5 is another example waveform diagram associated with the dynamic flip flop having the data independent P-stack feedback mechanism in accordance with some embodiments.

FIG. 5 is another example waveform diagram 500 associated with the dynamic flip flop 400 having the data independent P-stack feedback mechanism in accordance with some embodiments. Reference is now made to FIGS. 4A, 4B, and 5.

When the clock signal CK is a logical 0, the node 118 associated with the signal ZZ1 is pulled to a logical 1, or in other words it is pre-charged. With all the MUX inputs A[0 . . . N−1] set to a logical 0, when the clock signal CK transitions from a logical 0 to a logical 1, as shown in 510, the output signal QN transitions from a logical 0 to a logical 1.

Consider the situation where the MUX inputs A[0 . . . N−1] transition from a logical 0 to a logical 1, the select signals S0[0 . . . N−1] transition from a logical 0 to a logical 1, and the clock signal CK is at a logical 0. A and S0 can be input buses each of N bits. In the waveform shown in FIG. 5, only one input A is plotted and the corresponding select signal S0 by way of example. In practice, there can be multiple inputs A[0 . . . N−1] and multiple corresponding select signals S0[0 . . . N−1]. When the clock signal CK transitions from a logical 0 to a logical 1, the NMOS stack of the N-stack section 410 evaluates pulling the node 118 associated with the signal ZZ1 from a logical 1 to a logical 0, and therefore, the output signal QN transitions from a logical 1 to a logical 0, as shown at 505. The data independent P-stack feedback circuit 405 eliminates any race condition within the circuit.

Figure 6A:
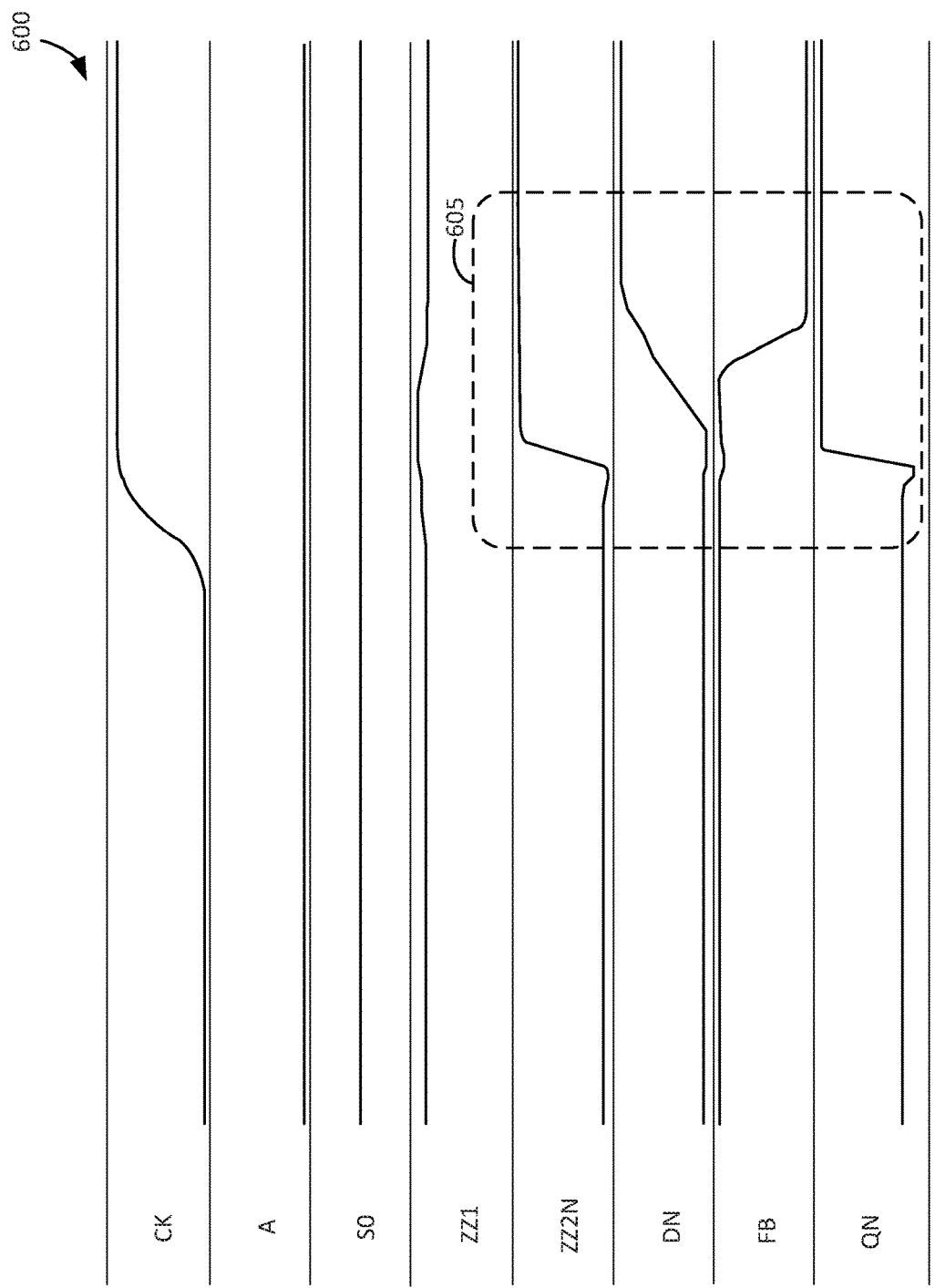
FIG. 6A is yet another example waveform diagram showing a pass simulation associated with the dynamic flip flop having the data independent P-stack feedback mechanism.
Figure 6B:
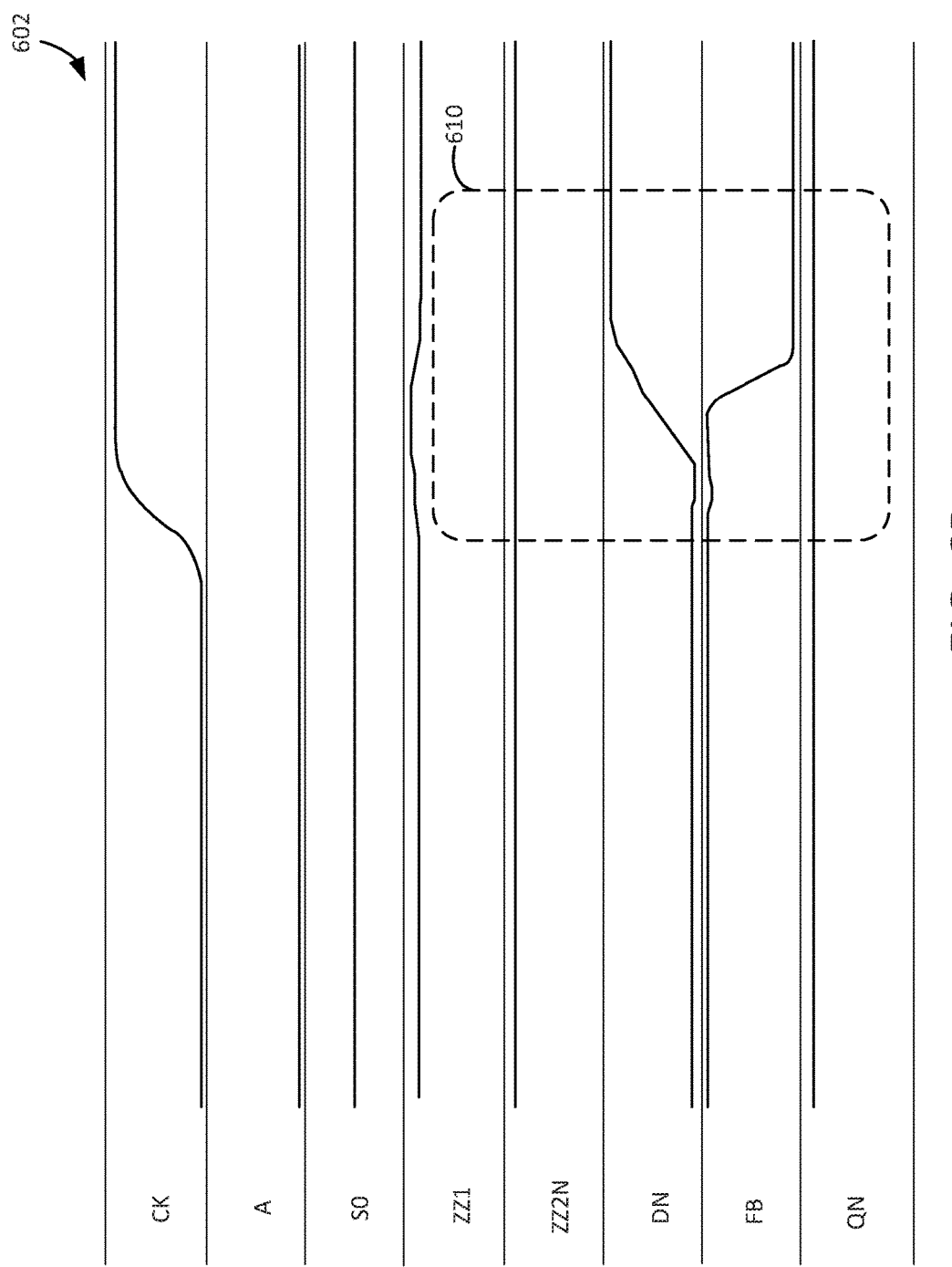
FIG. 6B is a waveform diagram showing a fail simulation.

FIG. 6A is yet another example waveform diagram 600 showing a pass condition associated with the dynamic flip flop having the data independent P-stack feedback mechanism. The window 605 is similar to the window 510 of FIG. 5. FIG. 6B is a waveform diagram 605 showing a fail simulation 610 in the event that the race condition is not mitigated. As disclosed herein, the data independent P-stack feedback circuit 405 eliminates any race condition within the circuit so that the fail condition 610 does not occur.

Accordingly, various single stage combinational circuit elements may be integrated into a dynamic flip flop having data pin independent P-stack feedback and inventive delay techniques. This allows the circuit to operate with similar or better speed (CK to Q), and similar or better setup on data pins compared to conventional dynamic flip flops. The result is better area, and a dramatic improvement in the setup on data pins versus simply stitching the combinational circuit with the conventional dynamic flop. The area benefit is due to fewer devices used as the need of PMOS devices present in a typical N:1 MUX is eliminated. Leakage power is also recovered by using mixed VT and different poly length techniques within the circuit. Better setup compared to simply stitching the MUX and dynamic flop with a comparable CK2Q delay is achieved. Routing congestion is improved in the dense areas where the routing track availability is much less. Moreover, the complete cell is modeled accurately rather than depending on wire models.

Figure 7:
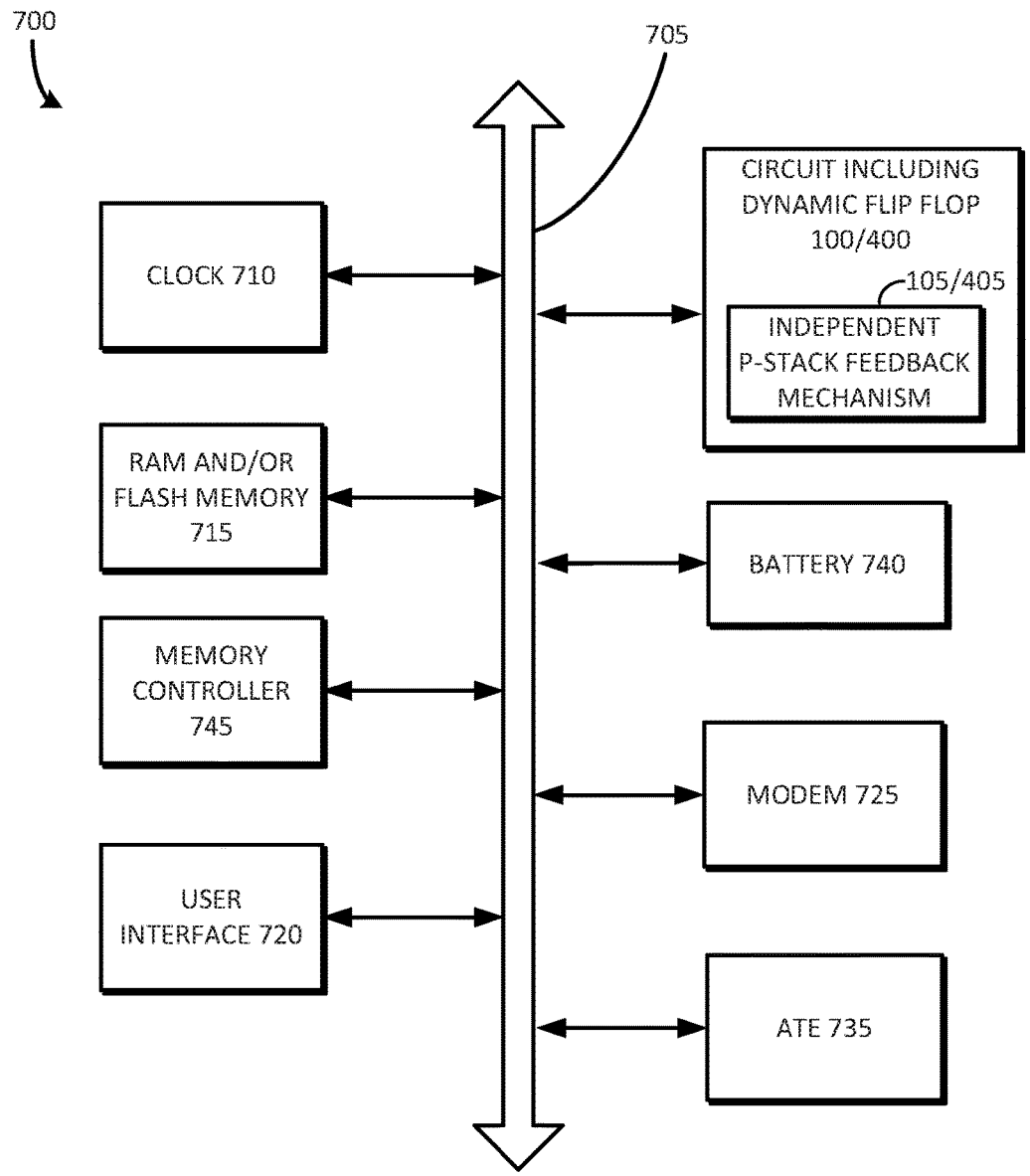
FIG. 7 is an example block diagram of a computing system including a dynamic flip flop having the data independent P-stack feedback mechanism according to embodiments of the inventive concept as disclosed herein.

FIG. 7 is an example block diagram of a computing system including a dynamic flip flop 100/400 having the data independent P-stack feedback mechanism 105/405 according to embodiments of the inventive concept as disclosed herein. The dynamic flip flop 100/400 as disclosed herein may be electrically connected to a system bus 705.

The computing system 700 may also include a clock 710, a random access memory (RAM) and/or flash memory 715, a memory controller 745, a user interface 720, a modem 725 such as a baseband chipset, and/or automated test equipment (ATE) 735, any or all of which may be electrically coupled to the system bus 705.

If the computing system 700 is a mobile device, it may further include a battery 740, which powers the computing system 700. Although not shown in FIG. 7, the computing system 700 may further include an application chipset, a camera image processor (CIS), a mobile DRAM, and the like. The memory controller 745 and the flash memory 715 may constitute a solid state drive/disk (SSD), which uses a nonvolatile memory to store data.

In example embodiments, the computing system 700 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

The various operations of methods described above may be performed by any suitable means capable of performing the operations, such as various hardware and/or software component(s), circuits, and/or module(s).

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A dynamic flip flop, comprising:
a P-stack feedback circuit, including:
a first P-type transistor gated by a first dynamic inverted signal; and
a second P-type transistor gated by an inverted clock signal, wherein:
a drain of the second P-type transistor is coupled to a source of the first P-type transistor;
a source of the second P-type transistor is coupled to a node that is configured to receive a second dynamic inverted signal; and
one or more delay stages disposed between the first P-type transistor and the second P-type transistor; and
an N-stack section including a plurality of N-type transistors each gated by a data input signal.

2. The dynamic flip flop of claim 1, wherein the source of the second P-type transistor is directly coupled to the node that is configured to receive the second dynamic inverted signal instead of a constant power source.

3. The dynamic flip flop of claim 1, wherein the drain of the second P-type transistor is directly coupled to the source of the first P-type transistor.

4. The dynamic flip flop of claim 3, wherein the P-stack feedback circuit does not include a transistor gated by a data input signal.

5. The dynamic flip flop of claim 1, further comprising an N-stack section including an N-type transistor gated by a data input signal.

6. The dynamic flip flop of claim 1, wherein the one or more delay stages include two or more inverters.

7. The dynamic flip flop of claim 1, wherein the one or more delay stages include three delay stages.

8. The dynamic flip flop of claim 1, wherein the N-stack section further includes:
a second N-type transistor gated by a feedback signal;
a third N-type transistor gated by a clock signal; and
a fourth N-type transistor gated by the first dynamic inverted signal.

9. The dynamic flip flop of claim 1, wherein the P-stack feedback circuit further comprises:
one or more second delay stages disposed anywhere within the P-stack feedback circuit.

10. A dynamic flip flop, comprising:
a P-stack feedback circuit, including:
a first P-type transistor gated by a first dynamic inverted signal; and
a second P-type transistor gated by an inverted clock signal, wherein:
a drain of the second P-type transistor is coupled to a source of the first P-type transistor;
a source of the second P-type transistor is coupled to a node that is configured to receive a second dynamic inverted signal; and
an N-stack section including an N-type transistor gated by a data input signal,
wherein the N-type transistor is referred to as a first N-type transistor, and wherein the N-stack section further includes:
a second N-type transistor gated by a feedback signal;
a third N-type transistor gated by a clock signal; and
a fourth N-type transistor gated by the first dynamic inverted signal.

11. The dynamic flip flop of claim 10, wherein the P-stack feedback circuit further includes:
a third P-type transistor gated by the feedback signal; and
a fourth P-type transistor gated by the inverted clock signal.

12. The dynamic flip flop of claim 11, wherein:
the node is referred to as a first node;
a drain of the first P-type transistor is coupled to a second node;
the dynamic flip flop further comprises:
a fifth N-type transistor gated by the inverted clock signal and coupled to the second node; and
a sixth N-type transistor gated by the first dynamic inverted signal and coupled to the second node.

13. The dynamic flip flop of claim 12, further comprising:
an intermediate section, comprising:
a fifth P-type transistor gated by the feedback signal and coupled to a third node associated with a first dynamic signal;
a sixth P-type transistor gated by the clock signal and coupled to the third node associated with the first dynamic signal.

14. The dynamic flip flop of claim 13, further comprising:
an output section, including:
a seventh P-type transistor gated by the first dynamic signal;
an eighth P-type transistor gated by the clock signal;
a ninth P-type transistor gated by the second dynamic inverted signal;
a seventh N-type transistor gated by the clock signal;
an eighth N-type transistor gated by the first dynamic signal; and
a ninth N-type transistor gated by the second dynamic inverted signal.

15. A circuit of a dynamic flip flop, the circuit comprising:
a P-stack feedback circuit, including:
a first P-type transistor gated by a first dynamic inverted signal; and
a second P-type transistor gated by an inverted clock signal, wherein:
a drain of the second P-type transistor is coupled to a source of the first P-type transistor; and
a source of the second P-type transistor is coupled to a node that is configured to receive a second dynamic inverted signal; and
an N-stack section including a plurality of N-type transistors each gated by a data input signal.

16. The circuit of claim 15, wherein the source of the second P-type transistor is directly coupled to the node that is configured to receive the second dynamic inverted signal instead of a constant power source.

17. The circuit of claim 15, further comprising one or more delay stages disposed between the first P-type transistor and the second P-type transistor.

18. The circuit of claim 17, wherein the one or more delay stages include three delay stages.

* * * * *